United States Patent [19]

Kranitzky

[11] Patent Number: 5,105,159

[45] Date of Patent: Apr. 14, 1992

[54] EVALUATING CIRCUIT FOR SQUARE WAVE SIGNALS

[75] Inventor: Walter Kranitzky, Traunstein, Fed. Rep. of Germany

[73] Assignee: Dr. Johannes Heidenhain GmbH, Traunreut, Fed. Rep. of Germany

[21] Appl. No.: 577,094

[22] Filed: Sep. 4, 1990

Related U.S. Application Data

[63] Continuation of Ser. No. 243,887, Sep. 13, 1988, abandoned.

[30] Foreign Application Priority Data

Sep. 30, 1987 [DE] Fed. Rep. of Germany ....... 3732962

[51] Int. Cl.⁵ .............................................. H03K 7/00
[52] U.S. Cl. .................................... 328/63; 328/109; 328/133; 328/135
[58] Field of Search ................. 328/63, 109, 133, 135; 377/39; 307/310, 311

[56] References Cited

U.S. PATENT DOCUMENTS

| | | | |
|---|---|---|---|
| 3,504,290 | 3/1970 | Earle | 377/39 |
| 3,621,403 | 11/1971 | Seiy | 377/39 |
| 3,673,391 | 6/1972 | Lougheed | 377/39 |
| 3,997,764 | 12/1976 | Belmonte et al. | 377/39 |
| 4,087,793 | 5/1978 | Lucas | 377/39 |
| 4,115,865 | 9/1978 | Beauvois et al. | 324/77 |
| 4,122,332 | 11/1978 | Wilkinson | 377/39 |
| 4,439,729 | 3/1984 | Claussen | 328/133 |
| 4,509,044 | 4/1985 | Yachida | 377/39 |
| 4,587,579 | 5/1986 | Cocke et al. | 360/77.03 |
| 4,606,053 | 8/1986 | Schroder | 328/63 |
| 4,764,685 | 8/1988 | Bleckmann et al. | 324/160 |

Primary Examiner—Stanley D. Miller
Assistant Examiner—Terry D. Cunningham
Attorney, Agent, or Firm—Willian, Brinks, Olds, Hofer, Gilson & Lione

[57] ABSTRACT

An evaluating circuit for evaluating square wave signals is provided. A plurality of square wave signals are transmitted to a memory which has a number of bistable toggle stages which correspond to the number of square wave signals. The toggle stages are driven by an auxiliary clock signal. An up-down counter is also driven by the auxiliary clock. The circuit further includes a comparator which compares the square wave signals and the state of the up-down counter and generates a control signal over at least one control line to the up-down counter in response to the comparison. The state of the up-down counter is changed in an up or down direction or not changed in response to the control signal.

8 Claims, 3 Drawing Sheets

EVALUATING CIRCUIT FOR SQUARE WAVE SIGNALS

This is a continuation of application Ser. No. 07/243,887, filed Sept. 13, 1988, now abandoned.

BACKGROUND OF THE INVENTION

The present invention relates generally to an evaluating circuit for square wave signals.

It is known in the art that periodic analog signals are generated in incremental length or angle measuring systems by using a corresponding scanning unit in which a grid type incremental measuring graduation is scanned. In order to determine the direction of movement and to avoid errors due to the symmetry of the signals, such devices typically perform the scanning using four scanning fields which are offset by a quarter of the grid division in the measuring direction relative to each other.

Since in most cases the resolution corresponding to the grid division period of the measuring graduation is not sufficient, there have been a large number of proposals to subdivide the scanning signals.

For example, Swiss Patent CH-PS 407,569 discloses a subdividing circuit in which a large number of triggers are used to subdivide the scanning signals, thereby multiplying the scanning signals. The circuit disclosed in this reference however, provides no assurance that correspondingly fine subdivisions of the triggered signals will be synchronized with respect to their sequence and their flank spacing. Therefore, counting errors can occur in the incremental evaluation of the triggered square wave signals. Counting errors may depend on the degree of subdivision, on the measuring speed, on electrical and mechanical interfering influences (interference pulses, jarrings) and the like. These factors may lead to excessively small flank spacings, overlapping or inadmissible signal stages or signal sequences of the triggered signals.

Erroneous counts or measurements may not be perceptible from the display of the evaluating component during the measuring operation, since the last places of the display are illegible because of the rapid change of the display value. The measuring system must provide reliable measuring results which assure that all of the increments and all of the square wave signals recovered from the increments by the subdivision have actually been counted in the event that the measuring system comes to a standstill and if the measuring results are readable. Since the increments represent the measure for the path travelled over or covered, the sum, or in the negative measuring direction the difference, of all of the increments travelled over must correspond exactly to the display value.

All of the square wave signals may not be counted if, for example, the square wave signals which were recovered by subdividing the scanned signals have such a small flank spacing that they may not be reliably counted. In this event, the display provides a smaller measurement value than the value that has actually been covered by the measuring arrangement.

Similarly, the other faulty signal states discussed above may lead to erroneous measuring results.

JP Patent Abstract 59-105721 discloses a circuit for the synchronization of square wave signals. The disclosed arrangement uses a switching mechanism with bistable toggle stages. In the arrangement of this disclosure however, the synchronization is implemented by determining the nearest of several impulses.

U.S. Pat. No. 4,096,396 further discloses an oscillating system in which changes of the state of a plurality of timing networks depend on the states of the signals generated at the outputs of adjacent timing networks.

German Patent 35 23 551 discloses a process for synchronizing square wave signals using a circuit wherein a periodic auxiliary signal generator or clock times the sequence of the square wave signals. In the system disclosed in this reference changes of the signal state of a toggle stage are dependent on the signal state of adjacent toggle stages.

However, errors may still arise even with the use of this process. For example, in this arrangement the occurrence of two signal counting flanks catching up with one another may be perceive but not corrected.

Therefore in view of the above it is a primary object of the present invention to provide a more reliable evaluating circuit for square wave signals than the processes and circuits presently available in the art.

SUMMARY OF THE INVENTION

To achieve the foregoing and other objects and in accordance with the purposes of the present invention, an evaluating circuit is provided which evaluates a plurality of square wave signals. The circuit includes a memory which has clocked bistable toggle states and which is driven by a clock having a fixed periodic frequency. The memory receives as an input signal a predetermined parallel combination of the plurality of square wave signals. The evaluating circuit further comprises an up-down counter which is driven by the clock, and a comparator which compares the square wave signals to the state of the up-down counter. The comparator generates a control signal which is transmitted over at least one control line to the up-down counter in response to the comparison. The state of the up-down counter is changed in an up or down direction or not changed in response to the control signal.

Additional objects, advantages and novel features of the invention will be set forth in part in the description which follows, and in part will become apparent to those skilled in the art upon examination of the following or may be learned by practice of the invention. The objects and advantages of the invention may be obtained by means of the combinations, particularly pointed out in the appended claims.

DETAILED DESCRIPTION OF THE PRESENTLY PREFERRED EMBODIMENTS

Figure 1:
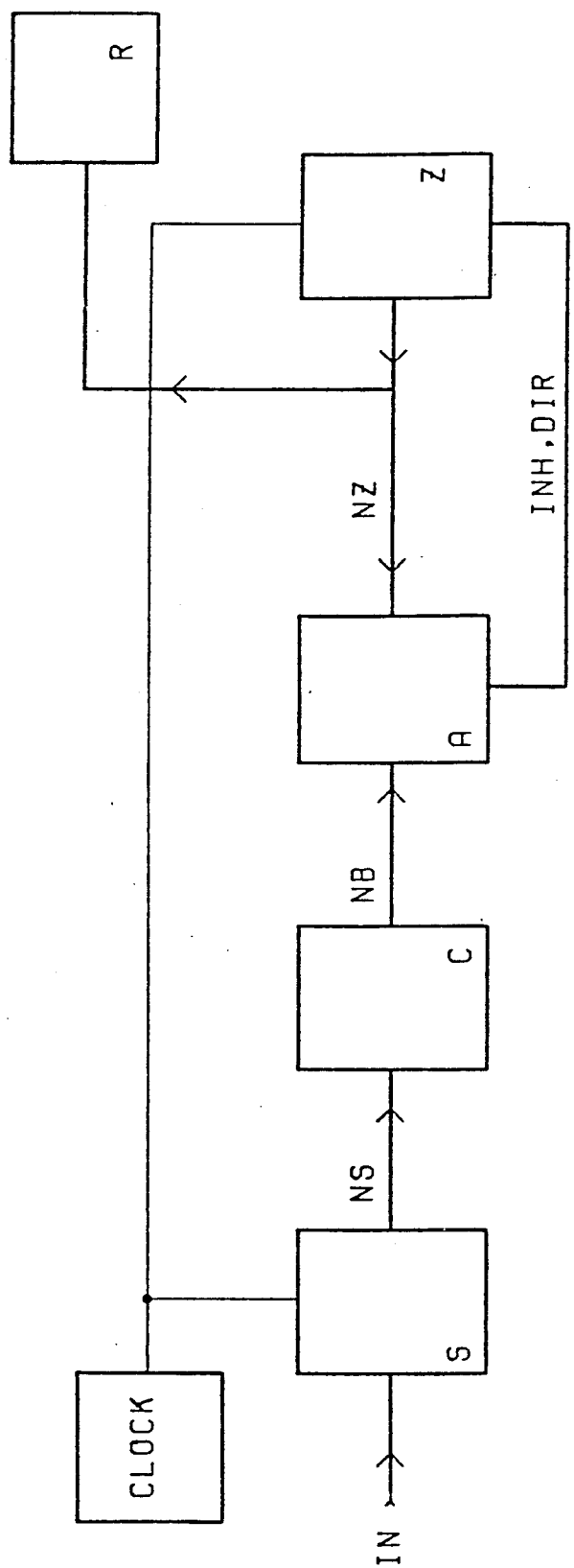
FIG. 1 is a circuit in block diagram form indicating a preferred embodiment of the present invention.

Referring now to the drawings, and specifically to FIGS. 1, a circuit embodying the present invention is illustrated in block diagram form, which circuit may be connected to a subdivision type electronic system (not illustrated) used in an incremental position measuring system of the type which has been described above.

Figure 2:
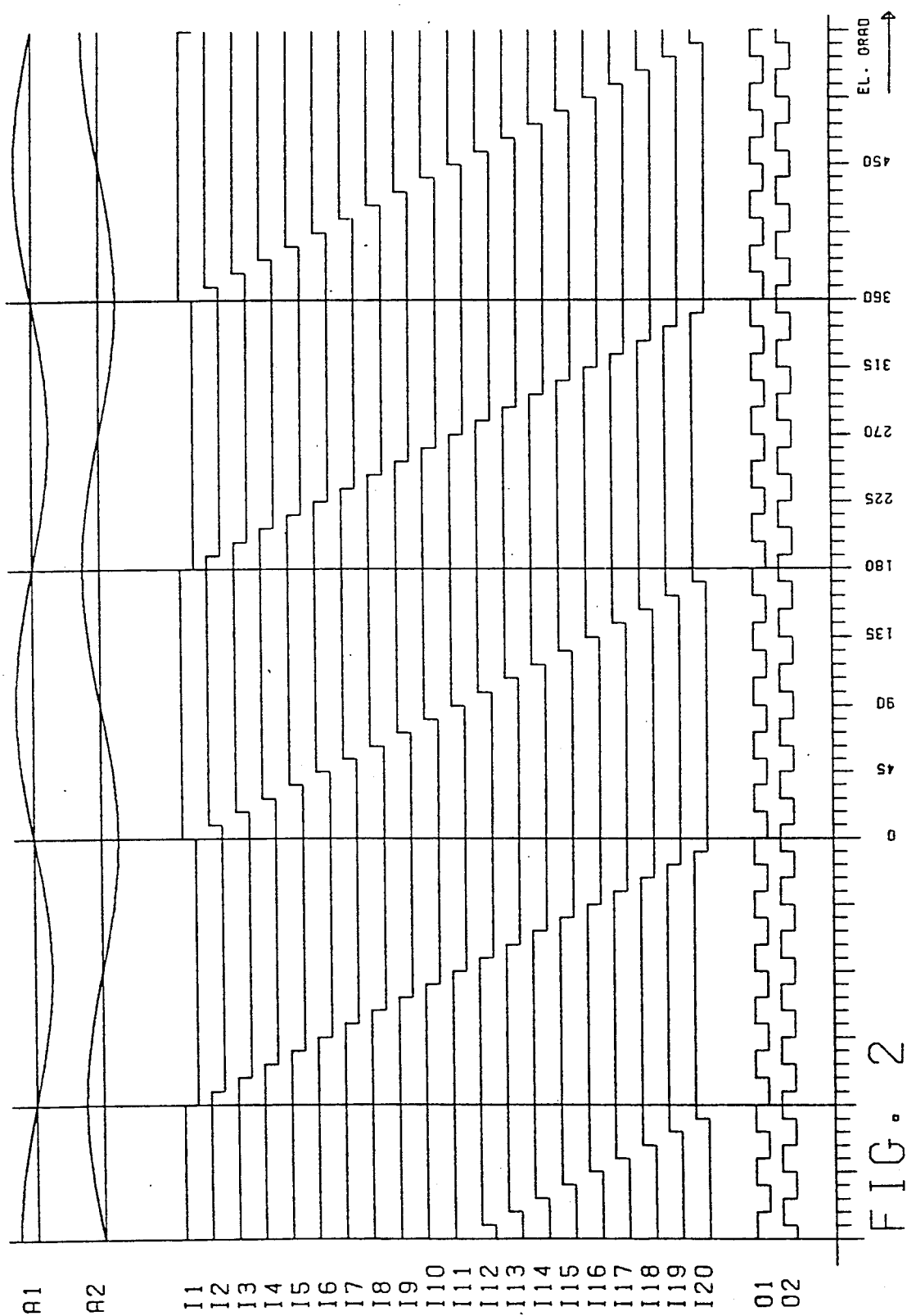
FIG. 2 illustrates the input and output signals of a subdivision type electronic system.

FIG. 2 represents square wave signals I1 to I20 which may be obtained by means of a known subdivision type electronic system of an incremental measuring apparatus from two analog scanning signals A1 and A2 which are phase shifted relative to one another by 90°. The square wave signals I1 to I20 are then fed to a memory S.

In the illustrated example, a subdivision factor of 10 is used such that a scale period is subdivided into 40 counting flanks. The sinusoidal scanning signals A1, A2, which are phase shifted by 90°, are combined in resistance networks to form sine signals with suitable phase angles. Comparators which receive the output from the resistance networks provide the square wave signals I1 to I20. The switching flanks of the square wave signals I1 to I20 correspond to the zero of the individual sine signals and are successively phase shifted by 9°.

The input and output signals I1 to I20 illustrated in FIG. 2 correspond to a subdivision type electronic system having a subdivision factor of 10 and assume interference free operation, ideal sinusoidal input currents and do not account for construction part tolerances and transit time effects. The illustrated system operates with 20 comparators which results in 40 counting flanks. In conventional subdivision circuits, two square signals (01, 02) which are phase-shifted by 90° are formed from the comparator signals. These generated signals (01, 02) are transmitted to a counter over a direction discriminator (not represented).

As a rule, however, ideal conditions cannot be assured in actual operation. Deviations of the input signals A1, A2 from the sine form, offset of the input signals, tolerances of the resistors and comparators as well as differing transit times of the individual sine signals may result in the flanks of the output signals I1 to I20 moving very close together if the scale is moved rapidly and thus the maximum frequency of the counter may be exceeded. Interfering pulses may result in sporadic flipping of individual components resulting in deviations from the 40 valid combinations of the output signals I1 to I20 which in turn will result in erroneous countings.

If clocked comparators (necessary for the integration in CMOS technology) are used instead of conventional, continuously operating comparators and if the maximum travelling speed of the scale is approached, code jumps in the output signals I1 to I20 will very frequently occur.

As illustrated in FIG. 1, in the present invention the 20 square wave signals I1 to I20 are first temporarily stored in a memory S. In the preferred embodiment, the memory S includes 20 flip-flops (not shown). The pulse inputs of the flip-flops are commonly driven by an auxiliary signal CLK, which is provided by an oscillator CLOCK. Preferably, the auxiliary signal comprises a fixed periodic frequency signal.

The pre-engaged subdivision electronic system results in 40 valid states which the flip-flops can occupy within a scale period; all of the remaining possible states are defined as invalid states.

The outputs of the flip-flops are connected with a code converter C which generates a numeric code and preferably a binary code NB which depends on the particular states of the output signal combinations NS at the outputs of the flip-flops.

An up-down counter Z which is preferably a binary counter, also delivers a binary code NZ which represents the state of the counter. The state of the counter is generated by adding the clock pulses that are transmitted by the above discussed auxiliary signal CLK to the counter Z. Control signals, which are described in more detail below, determine whether or not the counter Z will change state with the fixed clock pulses of the auxiliary signal CLK.

Both the binary code NB delivered from the code converter C and the binary code NZ representing the state of the up-down counter Z are transmitted to a comparator member A which compares the two codes NB and NZ. The comparator A is preferably connected over at least one control line INH, DIR with the up-down counter Z.

The state of the up-down counter Z will be changed in an up or down direction (according to the right sign (+ or −)) or not changed by the control signals (which are described in more detail below) provided over the control line INH, DIR. These signals depend on the result of the comparison of the two binary codes NB and NZ by the comparator A.

The state NZ of the counter Z may be evaluated in parallel and transmitted to a decoding circuit OS. The decoding circuit OS converts the binary code NZ into a 2-bit gray code. The gray code is converted into the output signals 01, 02 for an evaluating circuit R.

Figure 3:
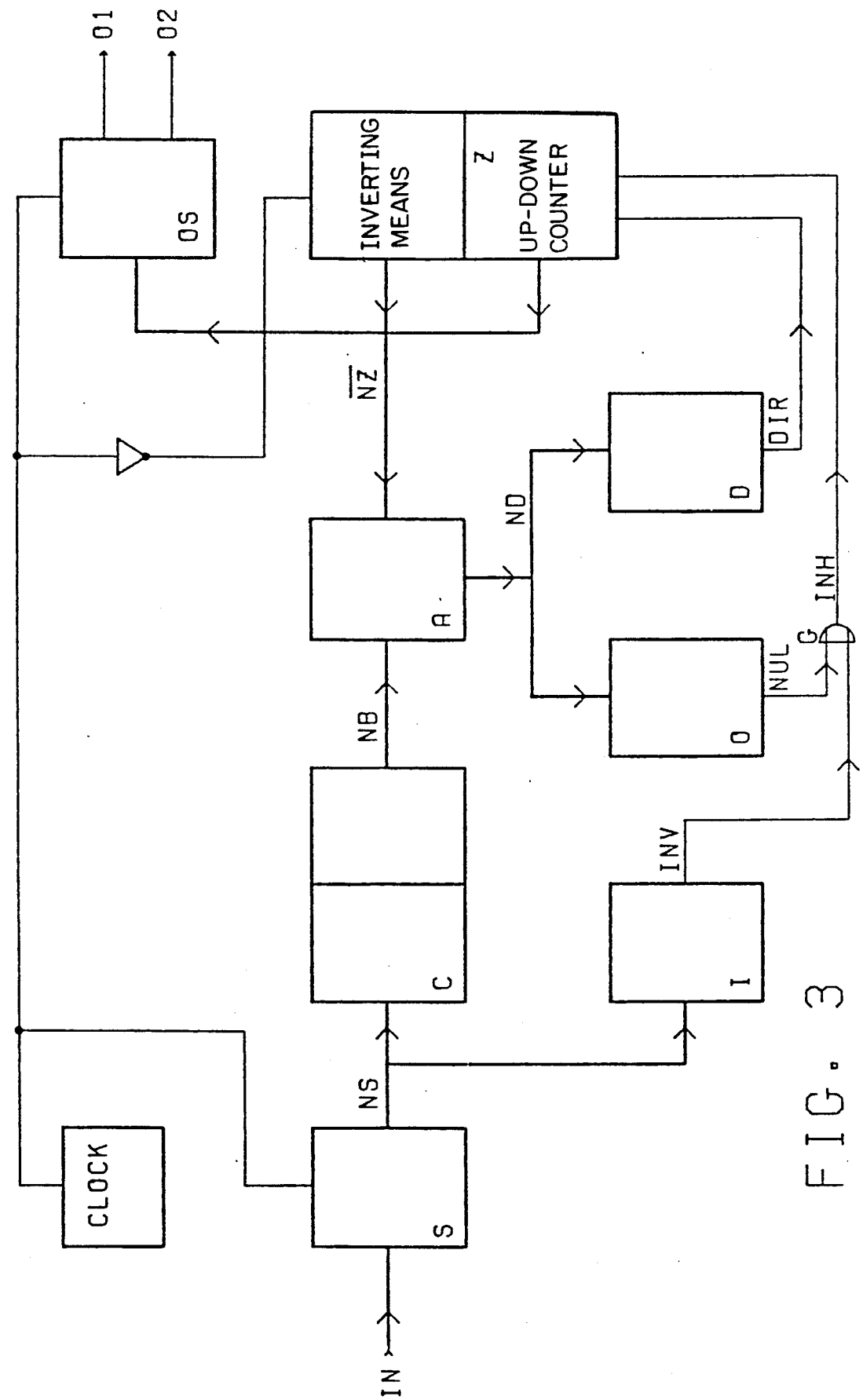
FIG. 3 is a circuit in block diagram form of a preferred embodiment of the circuit of FIG. 1.

FIG. 3 illustrates a particularly advantageous preferred embodiment of the present invention wherein, in addition to the code converter C, a logic component I is connected to the outlet side of the memory S. The logic component I checks the output signal combinations NS from the memory S for valid and invalid states. If it is determined that an invalid state is present, the logic component I transmits a blocking signal INV to the up-down counter Z over a control line INH.

The blocking signal INV prevents the auxiliary clock signal CLK from changing the state of the counter Z.

Preferably, the code converter C is implemented as a two stage transformer, in which the output signal combinations NS from the outputs of the memory S are first converted into a gray code and then into a binary code NB. This arrangement, with the use of a gray code converter, provides a particularly simple construction of the circuit.

In a preferred embodiment, the comparator A used for the comparison of the two binary codes NB (from the code converter C) and NZ (counter state of the up-down counter Z) comprises a binary adder. In this embodiment, the binary code NZ is inverted by an inverter to generate the inverted binary code of the state of the counter $\overline{NZ}$. The binary adder determines the difference of the two binary codes as the sum ND of the binary code NB and the inverted binary code $\overline{NZ}$ of the counter state.

Preferably a zero-selector 0 and a direction-selector D are connected to the output of the comparator A. The outputs of the zero-selector 0 and the direction-selector D are connected to the up-down counter Z.

If it is determined that no difference exists in the two binary codes NB and NZ, the zero-selector 0 provides a blocking signal NUL, which prevents the up-down counter Z from changing states. The blocking signal NUL has a function similar to the blocking signal INV which may be provided by the logic component I. Preferably, the blocking signal NUL and the blocking signal INV are connected over an OR-Gate with the outputs of the OR-Gate connected to the up-down counter Z over the control line INH.

If it is determined that a difference exists between the two binary codes NB and NZ, a control signal is provided by the direction-selector D and transmitted to the up-down counter Z over the control line DIR. The direction of change of the state and thus the counting direction of the counter Z depends on the sign of the difference of the two binary codes NB and NZ. Preferably the counting direction of the counter Z is selected such that the counter state NZ is always tracked in the direction of least difference.

Therefore the circuit of the present invention provides an evaluating circuit for square wave signals which is less prone to error than processes and circuits previously disclosed in the art.

The circuit of the present invention has several other advantageous features. After the circuit is switched on, the circuit automatically occupies a clearly defined state if a valid code is present, without the need for a resetting impulse. Deviations of the input code from the output code are compensated up to half a scale period. Disturbances of the output signal have substantially no effect on the outputs. The circuit is usable for any desired subdivision factor and the cost of increasing subdivisions is not linearly proportional to the number of subdivisions. Further the circuit may be easily cascaded.

The foregoing description of the preferred embodiments of the present invention has been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical applications, to thereby enable others skilled in the art to best utilize the invention in various embodiments and with various modifications as are suited to the particular use contemplated. It is intended that the scope of the invention be defined by the following claims, including all equivalents.

I claim:

1. In an evaluating circuit for evaluating a plurality of square wave signals, wherein a memory having a plurality of clocked bistable toggle states is driven by a clock having a fixed periodic frequency, said memory receiving as an input a predetermined parallel combination of said plurality of square wave signals, the improvement comprising:
   binary code converting means for converting an output of said memory into a numeric code representation of the output of said memory
   an up-down counter driven by said clock which generates a numeric code representing the state thereof;
   a comparator which compares an output of said code converter to the output of said up-down counter and generates a compare control signal over at least one control line to said up-down counter in response to said comparison; and
   a direction selector receiving said compare control signal, coupled between said comparator and said up-down counter, said direction selector generating a direction control signal in response to the comparison by said comparator;
   wherein the state of said up-down counter is changed in an up state or down state or not changed in response to said direction control signal.

2. The evaluating circuit of claim 1 wherein said numeric code representation of the state of said up-down counter comprises a first binary code and wherein said numeric code representation of the output of said memory comprises a second binary code.

3. The evaluation circuit of claim 2 wherein said binary code converting means comprises a code converter responsive to output signals from said memory and operative to convert said output signals from said memory to said second binary code and transmits said second binary code to said comparator and wherein said evaluating circuit further comprises a logic component responsive to said output signals from said memory and operative to determine whether said output signal is a predetermined valid state or a predetermined invalid state and generate a first blocking signal over said control line to said up-down counter upon the determination of an invalid state, said first blocking signal preventing the state of said up-down counter from changing.

4. The evaluating circuit of claim 1 wherein a zero-selector, receiving said compare control signal is coupled between said comparator and said up-down counter, said zero-selector responsive to said comparator and operative to generate a blocking signal to said up-down counter if the comparator control signal indicates that said counter state of said up-down counter and the output of said code converter are equal, said blocking signal preventing the state of said up-down counter from changing.

5. The evaluating circuit of claim 3 wherein a zero-selector, receiving said compare control signal is coupled between said comparator and said up-down counter, said zero-selector responsive to said comparator and operative to generate a second blocking signal to said up-down counter if the comparator control signal indicates that said counter state of said up-down counter and the output of said code converter are equal, said second blocking signal preventing the state of said up-down counter from changing and wherein said first and second blocking signals from said logic component and said zero-selector are transmitted as inputs to an OR-Gate, the output of said OR-Gate transmitted to said up-down counter.

6. The evaluating circuit of claim 3 wherein said code converter comprises a first stage wherein said output signals are converted to a gray code and a second stage wherein said gray code is converted to a binary code.

7. The evaluating circuit of claim 3 further comprising means for inverting said first binary code from said up-down counter and wherein said comparator comprises a binary adder, said binary adder receiving as inputs said second binary code from said binary code converting means converter and said inverted binary code from said up-down counter and said binary adder generating a difference therefrom.

8. In an evaluating circuit for evaluating a plurality of square wave signals, wherein a memory having a plurality of clocked bistable toggle states is driven by a clock having a fixed periodic frequency, said memory receiving as an input a predetermined parallel combination of said plurality of square wave signals, the improvement comprising:
   an up-down counter driven by said clock, wherein the state of said up-down counter is output in the form of a first binary code;
   a code converter operative to convert an output of said memory to a second binary code;
   a comparator which compares said binary code from an output of said code converter to the output of said up-down counter and generates a compare control signal over at least one control line to said up-down counter in response to said comparison; and a direction selector receiving said compare control signal, coupled between said comparator and said up-down counter, said direction selector generating a direction control signal in response to the comparison by said comparator, wherein the state of said up-down counter is changed in an up state or down state in response to said direction control signal.

* * * * *

UNITED STATES PATENT AND TRADEMARK OFFICE
CERTIFICATE OF CORRECTION

PATENT NO.  :  5,105,159
DATED       :  April 14, 1992
INVENTOR(S) :  Walter Kranitzky It is certified that error appears in the above-identified patent and that said Letters Patent is hereby corrected as shown below:

IN THE BACKGROUND OF THE INVENTION

Column 2, line 17, please delete "perceive" and substitute therefor --perceived--.

IN THE DETAILED DESCRIPTION OF
THE PRESENTLY PREFERRED EMBODIMENTS

Column 2, line 61, please delete "FIGS." and substitute therefor --FIG.--.

IN THE CLAIMS

Claim 2, line 4, before "output" please delete "the" and substitute therefor --an--.

Claim 3, line 1, please delete "evaluation" and substitute therefor --evaluating--.

Claim 4, line 3, after "signal" please insert --,--.

UNITED STATES PATENT AND TRADEMARK OFFICE
CERTIFICATE OF CORRECTION

PATENT NO. : 5,105,159

DATED : April 14, 1992

INVENTOR(S) : Walter Kranitzky

It is certified that error appears in the above-identified patent and that said Letters Patent is hereby corrected as shown below:

Claim 5, line 3, after "signal" please insert --,--.

Signed and Sealed this

Twenty-fifth Day of January, 1994

*Attest:*

BRUCE LEHMAN

*Attesting Officer*     *Commissioner of Patents and Trademarks*